(12) United States Patent
B et al.

(10) Patent No.: US 12,704,397 B2
(45) Date of Patent: Aug. 11, 2026

(54) FLOW SENSING DEVICE AND ASSOCIATED METHOD

(71) Applicant: HONEYWELL INTERNATIONAL INC., Charlotte, NC (US)

(72) Inventors: Manjesh B, Charlotte, NC (US); Jamie Speldrich, Charlotte, NC (US); Sudheer Beligere Sreeramu, Charlotte, NC (US); Somraj Suresh, Charlotte, NC (US)

(73) Assignee: HONEYWELL INTERNATIONAL INC., Charlotte, NC (US)

(*) Notice: Subject to any disclaimer, the term of this patent is extended or adjusted under 35 U.S.C. 154(b) by 346 days.

(21) Appl. No.: 18/595,991

(22) Filed: Mar. 5, 2024

(65) Prior Publication Data

US 2024/0318992 A1 Sep. 26, 2024

(30) Foreign Application Priority Data

Mar. 20, 2023 (IN) ............................ 202311018865

(51) Int. Cl.
*G01F 15/14* (2006.01)
*H05K 1/182* (2026.01)

(52) U.S. Cl.
CPC ............. *G01F 15/14* (2013.01); *H05K 1/182* (2013.01); *H05K 2201/09063* (2013.01); *H05K 2201/10151* (2013.01)

(58) Field of Classification Search
CPC ........ G01F 1/6842; G01F 15/14; G01F 15/18; H05K 1/182; H05K 2201/09063; H05K 2201/10151
See application file for complete search history.

(56) References Cited

U.S. PATENT DOCUMENTS 7,107,860 B2 9/2006 Jones
7,631,562 B1 * 12/2009 Speldrich ................. G01F 1/68 73/861.52

(Continued)

FOREIGN PATENT DOCUMENTS

AU 2012260573 A1 11/2013
CN 1993605 A 7/2007

(Continued)

OTHER PUBLICATIONS

Decision to grant a European patent Mailed on Jan. 9, 2026 for EP Application No. 24159257, 2 page(s).

(Continued)

*Primary Examiner* — Kristina M Deherrera
*Assistant Examiner* — Gedeon M Kidanu
(74) *Attorney, Agent, or Firm* — Alston & Bird LLP

(57) ABSTRACT

A flow sensing device is provided. For example, a flow sensing device may include a housing, a printed circuit board assembly (PCBA) having a first major surface and an opposing second major surface, a sensing element disposed on the first major surface, and a flow tube defining a flow path configured to convey a flowing media. The flow tube comprises an elongated main body, a fluid inlet tube, and a fluid outlet tube. The flow tube is disposed such that the elongated main body is proximate the first major surface of the PCBA, the fluid inlet tube protrudes through a first PCBA through-hole to position the opening of the fluid inlet tube proximate the second major surface of the PCBA, and the fluid outlet tube protrudes through a second PCBA through-hole to position the opening of the fluid outlet tube proximate the second major surface of the PCBA.

16 Claims, 3 Drawing Sheets

(56) References Cited

U.S. PATENT DOCUMENTS

| | | | | |
|---|---|---|---|---|
| 7,891,238 | B2 * | 2/2011 | Becke | G01F 1/6845 73/170.12 |
| 10,137,244 | B2 | 11/2018 | Anand | |
| 11,781,894 | B2 * | 10/2023 | Bestic | G01F 1/363 73/861.42 |
| 2002/0078744 | A1 | 6/2002 | Gehman et al. | |
| 2009/0249869 | A1 | 10/2009 | Meier et al. | |
| 2010/0154532 | A1 | 6/2010 | Becke et al. | |
| 2012/0291540 | A1 | 11/2012 | Cooke et al. | |

FOREIGN PATENT DOCUMENTS

| | | | |
|---|---|---|---|
| EP | 1344027 | B1 | 12/2008 |
| EP | 2107347 | A1 | 10/2009 |
| EP | 2202495 | A1 | 6/2010 |
| WO | 2019/094842 | A1 | 5/2019 |

OTHER PUBLICATIONS

Extended European Search Report Mailed on Aug. 16, 2024 for EP Application No. 24159257, 5 page(s).

Fluid Handling Pro, “Bernoulli Equation and the Venturi Effect”, retrieved from the Internet at URL: <https://fluidhandlingpro.com/fluid-process-technology/fluid-flow-control-measurement/bernoulli-equation-and-the-venturi-effect/> on Jul. 23, 2025, 4 pages.

Communication about intention to grant a European patent Mailed on Sep. 3, 2025 for EP Application No. 24159257, 6 page(s).

* cited by examiner

FLOW SENSING DEVICE AND ASSOCIATED METHOD

CROSS-REFERENCE TO RELATED APPLICATIONS

This application claims priority pursuant to 35 U.S.C. 119(a) to Indian application Ser. No. 202311018865, filed Mar. 20, 2023, which application is incorporated herein by reference in its entirety.

FIELD OF THE INVENTION

Embodiments of the present disclosure generally relate to sensors, and, more particularly, to flow sensors.

BACKGROUND

Flow sensing devices may be used to measure a flow rate and/or quantity of a moving liquid and/or gas and may be implemented in various applications. For example, a flow sensing device may be a part of a system for measuring and/or controlling the dosing of liquid or gas.

Such flow sensing devices are plagued by technical challenges and limitations. Through applied effort, ingenuity, and innovation, many of these identified problems have been solved by developing solutions that are included in embodiments of the present disclosure, many examples of which are described in detail herein.

BRIEF SUMMARY

Various embodiments described herein relate to flow sensing devices and associated methods of assembling a flow sensing device.

In accordance with various embodiments of the present disclosure, a flow sensing device is provided. In some embodiments, the flow sensing device comprises a housing, a printed circuit board assembly (PCBA) having a first major surface and an opposing second major surface and at least partially disposed within the housing, a sensing element disposed on the first major surface of and in electronic communication with the PCBA, and a flow tube at least partially disposed within the housing and at least partially defining a flow path configured to convey a flowing media through the flow sensing device. The PCBA defines at least a first PCBA through-hole and a second PCBA through-hole. The flow tube comprises (i) an elongated main body disposed proximate the first major surface of the PCBA, (ii) a fluid inlet tube in fluid communication with the main body and defining an opening for the flowing media to enter the flow tube, and (iii) a fluid outlet tube in fluid communication with the main body and defining an opening for the flowing media to exit the flow tube. The flow path is disposed proximate the sensing element such that at least a portion of the flowing media makes direct contact with the sensing element. The flow tube is disposed such that (i) the elongated main body is proximate the first major surface of the PCBA, (ii) the fluid inlet tube protrudes through the first PCBA through-hole to position the opening of the fluid inlet tube proximate the second major surface of the PCBA, and (ii) the fluid outlet tube protrudes through the second PCBA through-hole to position the opening of the fluid outlet tube proximate the second major surface of the PCBA.

In some embodiments, the housing defines at least a first housing through-hole and a second housing through-hole, and the flow tube is disposed such that (i) the fluid inlet tube protrudes through the first housing through-hole to position the opening of the fluid inlet tube outside of the housing and (ii) the fluid outlet tube protrudes through the second housing through-hole to position the opening of the fluid outlet tube outside of the housing.

In some embodiments, the first housing through-hole is aligned with the first PCBA through-hole and the second housing through-hole is aligned with the second PCBA through-hole.

In some embodiments, the housing comprises an upper housing portion and a lower housing portion.

In some embodiments, the first housing through-hole and the second housing through-hole are defined in the upper housing portion.

In some embodiments, the lower housing portion at least partially defines the flow path.

In some embodiments, the fluid inlet tube is substantially perpendicular to the main body and the fluid outlet tube is substantially perpendicular to the main body.

In some embodiments, the flow sensing device further comprises one or more circuit elements in electronic communication with the sensing element to measure a flow signal from the sensing element and convert the flow signal from the sensing element into flow data to be output from the flow sensing device In accordance with various embodiments of the present disclosure, a method of assembling a flow sensing device is provided. In some embodiments, the method comprises providing a housing; providing a printed circuit board assembly (PCBA) having a first major surface and an opposing second major surface, the PCBA defining at least a first PCBA through-hole and a second PCBA through-hole, the PCBA comprising a sensing element on the first major surface of and in electronic communication with the PCBA; providing a flow tube at least partially defining a flow path configured to convey a flowing media through the flow sensing device, the flow tube comprising (i) an elongated main body, (ii) a fluid inlet tube in fluid communication with the main body and defining an opening for the flowing media to enter the flow tube, and (iii) a fluid outlet tube in fluid communication with the main body and defining an opening for the flowing media to exit the flow tube; at least partially disposing the PCBA within the housing; and at least partially disposing the flow tube within the housing, such that (i) the elongated main body is disposed proximate the first major surface of the PCBA, (ii) the flow path is disposed proximate the sensing element such that at least a portion of the flowing media makes direct contact with the sensing element; (iii) the fluid inlet tube protrudes through the first PCBA through-hole to position the opening of the fluid inlet tube proximate the second major surface of the PCBA, and (iv) the fluid outlet tube protrudes through the second PCBA through-hole to position the opening of the fluid outlet tube proximate the second major surface of the PCBA.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION OF THE INVENTION

Figure 1:
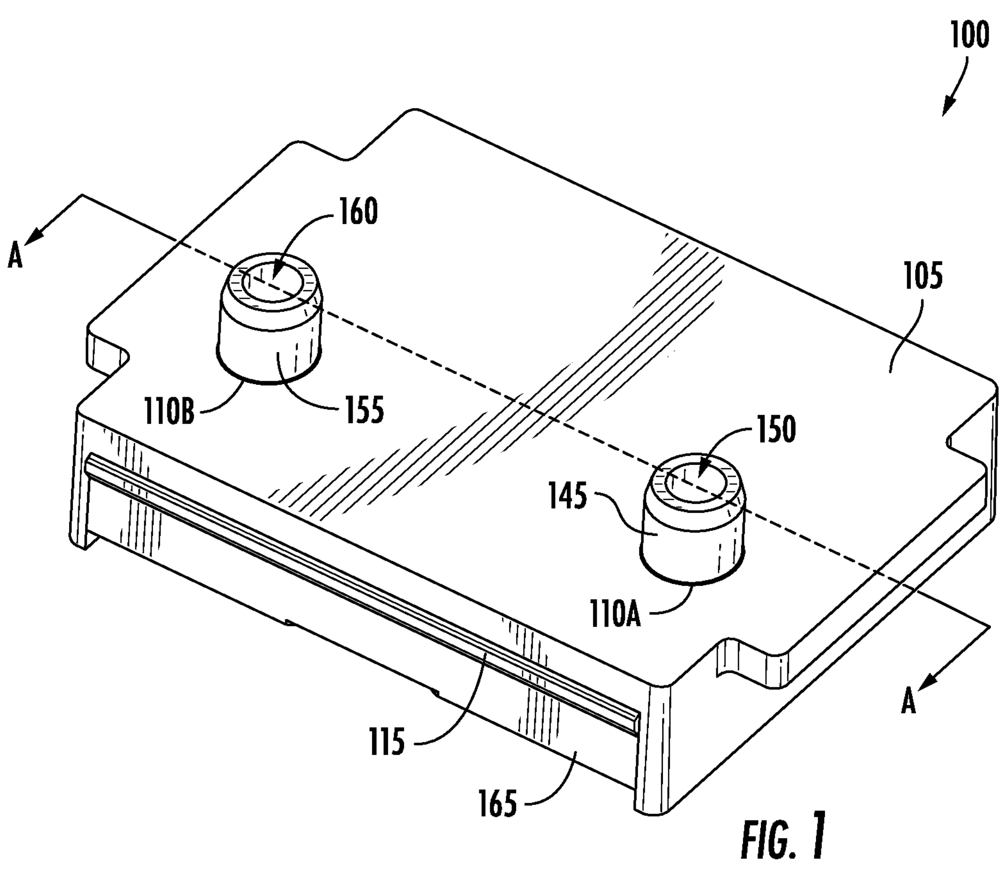
FIG. 1 is a top perspective view of an example flow sensing device, in accordance with some embodiments of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," "bottom," "left," "right," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The phrases "in one example," "according to one example," "in some examples," and the like generally mean that the particular feature, structure, or characteristic following the phrase may be included in at least one example of the present disclosure and may be included in more than one example of the present disclosure (importantly, such phrases do not necessarily refer to the same example).

If the specification states a component or feature "may," "can," "could," "should," "would," "preferably," "possibly," "typically," "optionally," "for example," "as an example," "in some examples," "often," or "might" (or other such language) be included or have a characteristic, that specific component or feature is not required to be included or to have the characteristic. Such component or feature may be optionally included in some examples, or it may be excluded.

The word "example" or "exemplary" is used herein to mean "serving as an example, instance, or illustration." Any implementation described herein as "example" or "exemplary" is not necessarily to be construed as preferred or advantageous over other implementations.

The term "electronically coupled," "electronically coupling," "electronically couple," "in communication with," "in electronic communication with," or "connected" in the present disclosure refers to two or more elements or components being connected through wired means and/or wireless means, such that signals, electrical voltage/current, data and/or information may be transmitted to and/or received from these elements or components.

The term "in fluid communication with" in the present disclosure refers to two or more elements or components being connected through one or more paths or pathways, such that a fluid or other flowing media may be input to and/or output from these elements or components.

The term "component" may refer to an article, a device, or an apparatus that may comprise one or more surfaces, portions, layers and/or elements. For example, an example component may comprise one or more substrates that may provide underlying layer(s) for the component and may comprise one or more elements that may form part of and/or are disposed on top of the substrate. In the present disclosure, the term "element" may refer to an article, a device, or an apparatus that may provide one or more functionalities.

The term "flow sensing device" refers to an apparatus that may detect, measure, and/or identify flow rate(s) (including, but not limited to, linear flow velocity, nonlinear flow velocity, mass flow rate, and/or volumetric flow rate) of a flowing medium or media. In the present disclosure, the term "flowing medium" or "flowing media" refers to a substance or substances (such as, but not limited to, liquid substance and/or gaseous substance) that can move or progress freely through a flow path of a flow sensing device. In the present disclosure, the term "fluid" refers to a substance (such as, but not limited to, liquid substance and/or gaseous substance) that is capable of flowing.

The term "flow path" may refer to a passageway through which a flowing media may flow, traverse or be conveyed. As will be described in detail further herein, an example flow path of the present disclosure may be defined/formed by and/or comprise one or more channels. An example channel may define a plurality of sidewalls. In various examples of the present disclosure, example dimensions of example cross sections of example flow channels may be in the microns to hundreds of microns in height and tens of microns to hundreds of microns in width. In various examples of the present disclosure, example flow channels may be greater than one hundred microns in length. In some examples, various applications of present disclosure may require laminar flow, which may be characterized by particles of the flowing media following smooth path(s) in the flow channel with little or no mixing (i.e. high momentum diffusion and low momentum convection). In contrast, turbulent flow may be characterized by particles of the flowing media undergo irregular fluctuations, or mixing. In some examples, a laminar flow for the flow sensing device may be achieved based on the flow rate of the flowing media. As described herein, examples of the present disclosure may be implemented in an infusion pump, where the flow rate may be less than a flow rate threshold (for example, between 0.02 milliliters per hour (mL/hr) and 0.5 mL/hr). As such, in some examples, turbulent flow may be avoided by receiving a flowing media that has a flow rate below a flow rate threshold to retain the flowing media as laminar flow.

Flow sensing devices may be utilized in a variety of applications including micropipetting, high-performance liquid chromatography (HPLC) applications, drug delivery, and/or the like. For example, an example flow sensing device may be implemented in an invasive or non-invasive drug delivery system to detect, measure, and/or identify a flow rate of a flowing media associated with the invasive or non-invasive drug delivery system. In such an example, an infusion pump may be implemented to deliver substance(s) (such as, but not limited to, fluids, medications and/or nutrients) into a patient's body in an invasive drug delivery system. The substance(s) may need to be delivered in controlled amounts. As such, an example flow sensing device may be implemented in the infusion pump to detect, measure, and/or identify the flow rate of substance(s) that may be delivered to the patient.

In various examples, the flow rate of a flowing media may need to be precisely measured. Continuing from the infusion pump example above, the flow rate of the substance(s) may need to be delivered at a low rate based on the condition of the patient and/or the treatment for the patient. For example, the substance(s) may need to be delivered at less than 5 milliliters per hour. If the flow rate is not precisely measured, a patient may be over-dosed or under-dosed, which may result in injuries, casualties, and/or deaths. For example, in 2019, there were at least 21 deaths of patients in the United States that were known to be caused at least partially by over infusion of drugs in invasive drug delivery systems, which incurred at least seven million dollars cost.

Flow sensing devices are used in many devices for which it is desirable for the device to be as small as possible. As such, the space available in such devices for a flow sensing device is limited. Thus, it is desirable to reduce the overall size of the flow sensing devices, while still maintaining functionality.

Using the systems, apparatuses and techniques disclosed herein, flow sensing devices with a reduced height as compared to some conventional flow sensing devices are provided.

To address challenges and limitations associated with measuring flow rates, various examples of the present disclosure may be provided. For example, various examples of the present disclosure may provide example flow sensing devices, apparatuses, methods, and systems.

In various embodiments, the present disclosure may provide a flow sensing device. An example flow sensing device comprises a housing, a printed circuit board assembly (PCBA) at least partially disposed within the housing, a sensing element at least partially disposed within the housing, and a flow tube at least partially disposed within the housing and defining a flow path configured to convey a flowing media through the flow sensing device. In such an example flow sensing device, the flow path may be disposed proximate the sensing element such that at least a portion of the flowing media makes direct contact with the sensing element.

Figure 3:
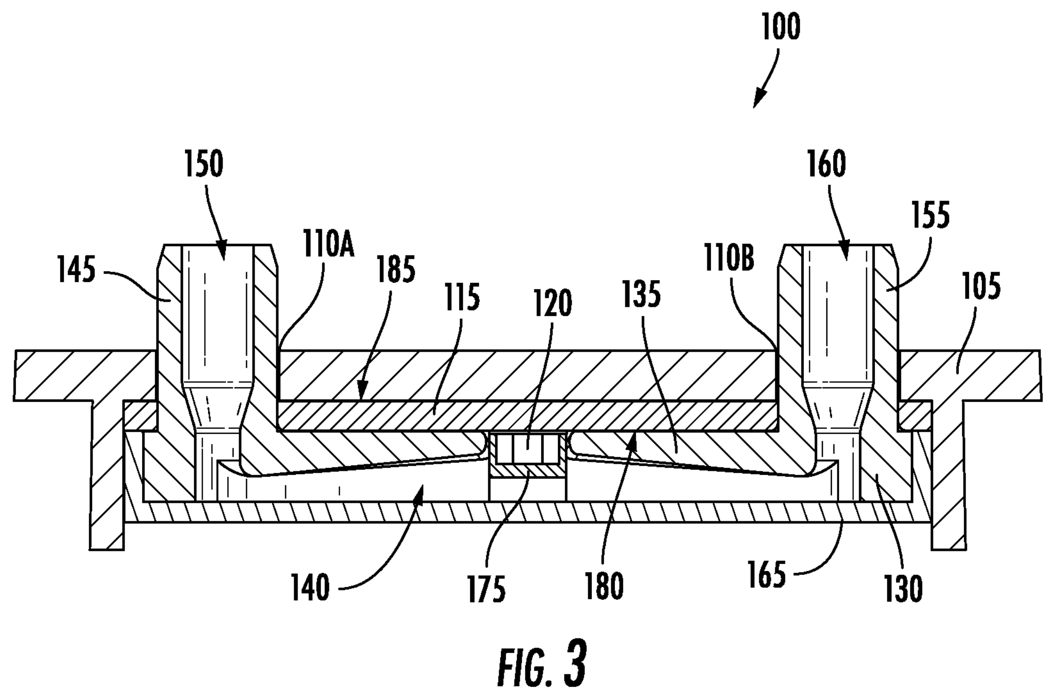
FIG. 3 is a cross-sectional view of the flow sensing device of FIG. 1, along line A-A.
Figure 2:
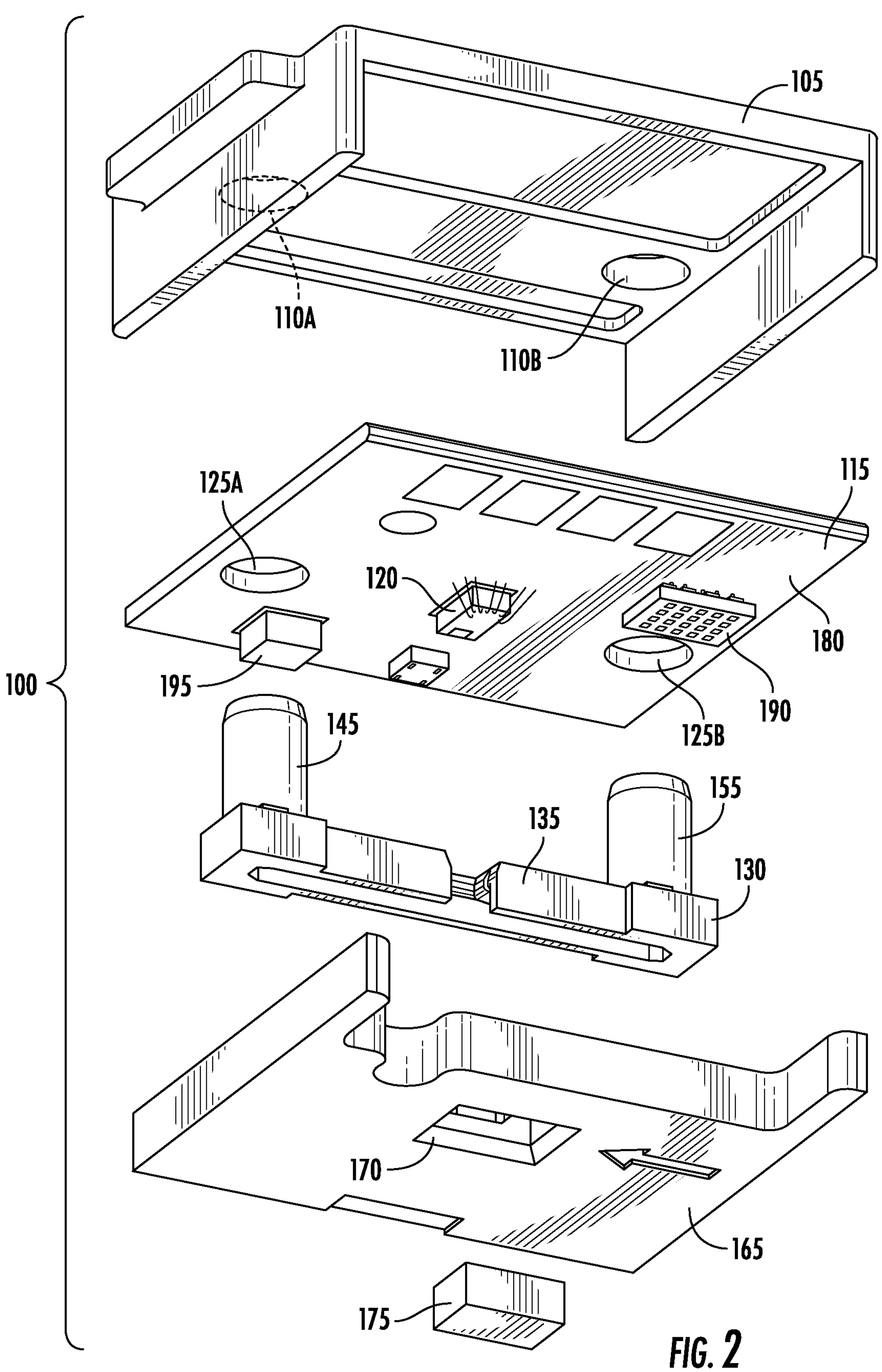
FIG. 2 is an exploded bottom perspective view of the flow sensing device of FIG. 1.

Referring now to FIGS. 1-3, a perspective view of an example flow sensing device 100 in accordance with various embodiments of the present disclosure is provided. As depicted in FIGS. 1-3, in some embodiments the flow sensing device 100 comprises a housing. In some embodiments, the housing is generally shaped like a rectangular prism and comprises two mating pieces—an upper housing portion 105 and a lower housing portion 165.

In various embodiments, the example housing may be constructed of or comprise plastic, biodegradable materials, poly(methyl methacrylate) (PMMA), cyclic olefine copolymers, polycarbonate, polystyrene, polyether ether ketone (PEEK), polytetrafluoroethylene (PTFE), liquid-crystal polymers (LCPs), polyetherimide (PEI), epoxy, PerFluoro-Alkoxy (PFA), fluorinated ethylene propylene (FEP), combinations thereof, and/or the like.

In some embodiments, the flow sensing device 100 comprises a printed circuit board assembly (PCBA) 115 having a first major surface 180 and an opposing second major surface 185. In some embodiments the PCBA 115 is at least partially disposed in the housing. The example PCBA 115 may comprise a thick film printed ceramic board, a laminate and/or other material. The example PCBA 115 may comprise an FR4 substrate. In various embodiments, the example PCBA 115 may comprise epoxy, ceramic, alumina, LCPs, and/or the like.

In various embodiments, the PCBA 115 may be in electronic communication with one or more circuit elements of the flow sensing device 100. By way of example, the example PCBA 115 may be in electronic communication with a sensing element 120 (e.g., sense die, transducer and/or the like) mounted thereon. In various embodiments, the sensing element 120, in conjunction with thermopiles which overlap the sensing element, produces a millivolt output in relation to the flow of fluid construction. In various examples, the PCBA 115 may be electrically connected to an example sensing element 120 (e.g., sense die) using various techniques. For example, wire bonds, bump bonds or the like may be utilized to electrically connect the example sensing element 120 to the PCBA 115. As depicted in FIG. 1, the example PCBA 115 comprises one or more electronic components thereon and/or pads for connecting to other electronic components of the flow sensing device 100 and/or other apparatuses. In some examples, the PCBA 115 may include an application specific integrated circuit (ASIC) 195 that may be attached to a surface of the PCBA 115, such as an ASIC electrically coupled to the PCBA 115 via wire bonds, bump bonds, electrical terminals, and/or any other suitable electrical connections. In various embodiments, the ASIC 195 converts the millivolt/ratio metric output from the sensing element into digital counts, using stored coefficients for the mathematical calculations related to the conversion. In some examples, the PCBA 115 may include a microcontroller 190 that may be attached to a surface of the PCBA 115, such as a microcontroller electrically coupled to the PCBA 115 via wire bonds, bump bonds, electrical terminals, and/or any other suitable electrical connections. In various embodiments, the microcontroller contains instructions for adjustments/corrections to the data from the ASIC 195 and provides an interface to provide the flow data to circuitry external to the flow sensing device 100. Additionally or alternatively, the example PCBA 115 may include one or more conductive pads for engaging circuitry and/or electronic components in communication with a remote processor or the like.

Additional description of example flow sensing devices, their electronic components, and their operation is found in U.S. patent application Ser. No. 17/249,443, filed Mar. 2, 2021, the contents of which are incorporated herein in its entirety.

As noted above, as depicted in FIG. 1, the example flow sensing device 100 comprises a sensing element 120. In some examples, the sensing element 120 may comprise a micro-electromechanical system (MEMS) die. The example MEMS die may comprise one or more other circuitries, including, but not limited to, additional temperature sensing circuitry, communication circuitry (for example, near field communication (NFC) circuitry), and/or power control circuitry, such that the MEMS die may be integrated with a control system (for example, a control system for an infusion pump). In some embodiments, the one or more circuitries may be part of the flow sensing device 100 and/or distinct from the flow sensing device 100. For example, the example MEMS die may be incorporated into an application-specific integrated circuit (ASIC) and may be external to the flow sensing device 100.

In various examples, the PCBA 115 may comprise one or more processing electronics and/or compensation circuitry (e.g., which may or may not include an ASIC). Such processing electronics may be electrically connected to terminals of the sensing element 120, an ASIC (if present), and/or electrical terminals to process electrical signals from the example sensing element 120 and/or to transfer outputs from the example sensing element 120 to electronic components of one or more apparatuses used in conjunction with the flow sensing device 100. In some instances, the PCBA 115 may include circuitry that may be configured to format one or more output signals provided by the example sensing element 120 into a particular output format. For example, circuitry of the PCBA 115 may be configured to format the output signal provided by the example sensing element 120 into a ratio-metric output format, a current format, a digital output format and/or any other suitable format. In some cases, the circuitry of the PCBA 115 may be configured to provide an output to one or more electrical terminals facilitating electrical connections with electronic components of one or more apparatuses used in conjunction with the flow sensing device 100. In some embodiments, one or more of the electronic components and/or electrical connections may be coated in an encapsulant 175, which may be applied through an opening 170 in the lower housing portion 165.

As noted above, the example flow sensing device 100 comprises a PCBA 115. In various examples, a surface of the upper housing portion 105 may be disposed adjacent a surface of the PCBA 115. For example, as depicted in FIG. 3, a bottom surface of the upper housing portion 105 of the flow sensing device 100 may be disposed adjacent and/or attached to the second major surface 185 of the PCBA 115.

As noted above, as depicted in FIG. 1, the example flow sensing device 100 comprises a flow tube 130 at least partially disposed within the housing. In some embodiments, the flow tube 130 at least partially defines a flow path 140 configured to convey a flowing media through the flow sensing device from an opening or inlet 150 to an opening or outlet 160. In various embodiments, the flow sensing device 100 may form part of and/or be connected to an external flow channel (e.g., via a first tube connected to the inlet 150 and a second tube connected to the outlet 160) such that a flowing media can be conveyed therethrough. In various embodiments, the inlet 150 and the outlet 160 may define or comprise slide-on fittings, Luer-Lock fittings, Swage-Lock fittings, and/or the like.

In some embodiments, the flow tube 130 comprises an elongated main body 135, a fluid inlet tube 145 in fluid communication with the main body 135, and a fluid outlet tube 155 in fluid communication with the main body 135. In some embodiments, the fluid inlet tube 145 defines the inlet 150 for the flowing media to enter the flow tube 130. Similarly, in some embodiments, the fluid outlet tube 155 defines the outlet 160 for the flowing media to exit the flow tube 130. In some embodiments, the fluid inlet tube 145 is substantially perpendicular to the main body 135 and the fluid outlet tube 155 is substantially perpendicular to the main body 135.

As described above and as seen in FIG. 3, in some embodiments the flow path 140 is disposed proximate the sensing element 120 such that at least a portion of the flowing media makes direct contact with the sensing element 120. In some embodiments, as seen in FIG. 3, the flow tube 130 is disposed proximate the first major surface 180 of the PCBA 115.

In some embodiments, the housing at least partially defines the flow path. As seen in FIG. 3, in the example flow sensing device 100 the lower housing portion 165 defines the bottom surface of the flow path 140.

In some embodiments, the PCBA 115 defines at least a first PCBA through-hole 125A and a second PCBA through-hole 125B. In some embodiments, the flow tube 130 is disposed such that the elongated main body 135 is proximate the first major surface 180 of the PCBA 115, such that the fluid inlet tube 145 protrudes through the first PCBA through-hole 125A to position the inlet 150 of the fluid inlet tube 145 proximate the second major surface 185 of the PCBA 115 and such that the fluid outlet tube 155 protrudes through the second PCBA through-hole 125B to position the outlet 160 of the fluid outlet tube 155 proximate the second major surface 185 of the PCBA 115.

In some embodiments the upper housing portion 105 defines at least a first housing through-hole 110A and a second housing through-hole 110B. In some embodiments, the first housing through-hole 110A and the second housing through-hole 110B are defined in the upper housing portion 105. In some embodiments, the first housing through-hole 110A is aligned with the first PCBA through-hole 125A and the second housing through-hole 110B is aligned with the second PCBA through-hole 125B. In this regard, in some embodiments, the flow tube 130 is disposed such that the fluid inlet tube 145 protrudes through the first housing through-hole 110A as well as through the first PCBA through-hole 125A and such that the fluid outlet tube 155 protrudes through the second housing through-hole 110B as well as through the second PCBA through-hole 125B.

By having the fluid inlet tube 145 and the fluid outlet tube 155 protrude through the PCBA 115 and exit the housing on the opposite side of the PCBA 115 from the flow tube 130, as seen in FIG. 3 (rather than having the fluid inlet tube 145 and the fluid outlet tube 155 exit the housing on the same side of the PCBA 115 from the flow tube 130), the overall height of the example flow sensing device 100 is reduced. This reduction in height enables a flow sensing device of embodiments of the disclosure to fit into smaller devices and/or to provide more flexibility in positioning such flow sensing devices in other devices.

While the description above provides an example flow sensing device 100, it is noted that the scope of the present disclosure is not limited to the description above. In some examples, an example flow sensing device 100 in accordance with the present disclosure may be in other forms. In some examples, an example flow sensing device 100 may comprise one or more additional and/or alternative elements, and/or may be structured/positioned differently than that illustrated in FIG. 1.

Figure 4:
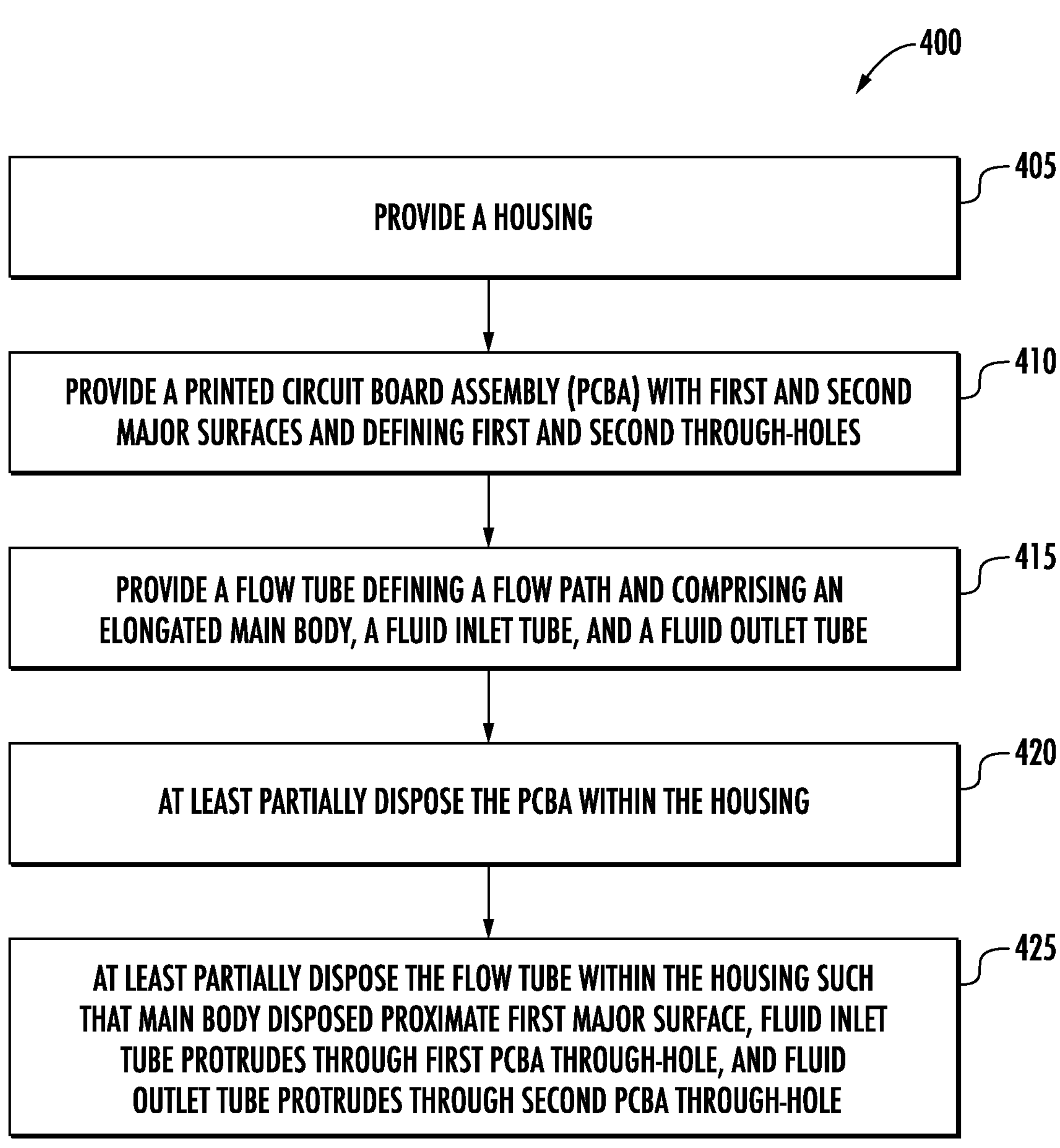
FIG. 4 is an example flowchart illustrating an example method of assembling a flow sensing device in accordance with example embodiments of the present disclosure.

Reference will now be made to FIG. 4, which provides a flowchart illustrating example steps, processes, procedures, and/or operations in accordance with various embodiments of the present disclosure. Various methods described herein, including, for example, methods as shown in FIG. 4, may provide various technical benefits and improvements.

Referring now to FIG. 4, an example method 400 is illustrated. In some embodiments, the example method comprises assembling a flow sensing device. At step/operation 405, a housing (such as, but not limited to, the upper housing portion 105 and the lower housing portion 165 of the example flow sensing device 100 described above in connection with FIGS. 1-3) is provided.

At step/operation 410, a printed circuit board assembly (such as, but not limited to, the PCBA 115 of the example flow sensing device 100 described above in connection with FIGS. 1-3) is provided.

At step/operation 415, a flow tube (such as, but not limited to, the flow tube 130 of the example flow sensing device 100 described above in connection with FIGS. 1-3) is provided.

As described above, the provided flow tube comprises an elongated main body, a fluid inlet tube, and a fluid outlet tube.

At step/operation 420, the printed circuit board assembly (such as, but not limited to, the PCBA 115 of the example flow sensing device 100 described above in connection with FIGS. 1-3) is at least partially disposed within the housing.

At step/operation 425, the flow tube (such as, but not limited to, the flow tube 130 of the example flow sensing device 100 described above in connection with FIGS. 1-3) is at least partially disposed within the housing such that such that the main body of the flow tube is disposed proximate a first major surface of the PCBA, the fluid inlet tube of the flow tube protrudes through a first PCBA through-hole, and the fluid outlet tube of the flow tube protrudes through a second PCBA through-hole.

Operations and processes described herein support combinations of means for performing the specified functions and combinations of operations for performing the specified functions. It will be understood that one or more operations, and combinations of operations, may be implemented by special purpose hardware-based computer systems which perform the specified functions, or combinations of special purpose hardware and computer instructions.

In some example embodiments, certain ones of the operations herein may be modified or further amplified as described below. Moreover, in some embodiments additional optional operations may also be included. It should be appreciated that each of the modifications, optional additions or amplifications described herein may be included with the operations herein either alone or in combination with any others among the features described herein.

The foregoing method and process descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," and similar words are not intended to limit the order of the steps; these words are simply used to guide the reader through the description of the methods. Further, any reference to claim elements in the singular, for example, using the articles "a," "an" or "the," is not to be construed as limiting the element to the singular and may, in some instances, be construed in the plural.

While various embodiments in accordance with the principles disclosed herein have been shown and described above, modifications thereof may be made by one skilled in the art without departing from the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present disclosure. Furthermore, any advantages and features described above may relate to specific embodiments but shall not limit the application of such issued claims to processes and structures accomplishing any or all of the above advantages or having any or all of the above features.

In addition, the section headings used herein are provided for consistency with the suggestions under 37 C.F.R. § 1.77 or to otherwise provide organizational cues. These headings shall not limit or characterize the disclosure set out in any claims that may issue from this disclosure. For instance, a description of a technology in the "Background" is not to be construed as an admission that certain technology is prior art to any disclosure in this disclosure. Neither is the "Summary" to be considered as a limiting characterization of the disclosure set forth in issued claims. Furthermore, any reference in this disclosure to "disclosure" or "embodiment" in the singular should not be used to argue that there is only a single point of novelty in this disclosure. Multiple embodiments of the present disclosure may be set forth according to the limitations of the multiple claims issuing from this disclosure, and such claims accordingly define the disclosure, and their equivalents, which are protected thereby. In all instances, the scope of the claims shall be considered on their own merits in light of this disclosure but should not be constrained by the headings set forth herein.

Also, systems, subsystems, apparatuses, techniques, and methods described and illustrated in the various embodiments as discrete or separate may be combined or integrated with other systems, modules, techniques, or methods without departing from the scope of the present disclosure. Other devices or components shown or discussed as coupled to, or in communication with, each other may be indirectly coupled through some intermediate device or component, whether electrically, mechanically, or otherwise. Other examples of changes, substitutions, and alterations are ascertainable by one skilled in the art and could be made without departing from the scope disclosed herein.

Many modifications and other embodiments of the disclosure set forth herein will come to mind to one skilled in the art to which these embodiments pertain having the benefit of teachings presented in the foregoing descriptions and the associated figures. Although the figures only show certain components of the apparatuses and systems described herein, various other components may be used in conjunction with the components and structures disclosed herein. Therefore, it is to be understood that the disclosure is not to be limited to the specific embodiments disclosed and that modifications and other embodiments are intended to be included within the scope of the appended claims. For example, the various elements or components may be combined, rearranged, or integrated in another system or certain features may be omitted or not implemented. Moreover, the steps in any method described above may not necessarily occur in the order depicted in the accompanying drawings, and in some cases one or more of the steps depicted may occur substantially simultaneously, or additional steps may be involved. Although specific terms are employed herein, they are used in a generic and descriptive sense only and not for purposes of limitation.

What is claimed is:

1. A flow sensing device comprising:

a housing;

a printed circuit board assembly (PCBA) at least partially disposed within the housing, the PCBA having a first major surface and an opposing second major surface, and the PCBA defining at least a first PCBA through-hole and a second PCBA through-hole;

a sensing element disposed on the first major surface of and in electronic communication with the PCBA; and a flow tube at least partially disposed within the housing and at least partially defining a flow path configured to convey a flowing media through the flow sensing device, the flow tube comprising (i) an elongated main body disposed proximate the first major surface of the PCBA, (ii) a fluid inlet tube in fluid communication with the main body and defining an opening for the flowing media to enter the flow tube, and (iii) a fluid outlet tube in fluid communication with the main body and defining an opening for the flowing media to exit the flow tube;

wherein the flow path is disposed proximate the sensing element such that at least a portion of the flowing media makes direct contact with the sensing element; and wherein the flow tube is disposed such that (i) the elongated main body is proximate the first major surface of the PCBA, (ii) the fluid inlet tube protrudes through the first PCBA through-hole to position the opening of the fluid inlet tube proximate the second major surface of the PCBA, and (iii) the fluid outlet tube protrudes through the second PCBA through-hole to position the opening of the fluid outlet tube proximate the second major surface of the PCBA.

2. The flow sensing device of claim 1, wherein the housing defines at least a first housing through-hole and a second housing through-hole; and wherein the flow tube is disposed such that (i) the fluid inlet tube protrudes through the first housing through-hole to position the opening of the fluid inlet tube outside of the housing and (ii) the fluid outlet tube protrudes through the second housing through-hole to position the opening of the fluid outlet tube outside of the housing.

3. The flow sensing device of claim 2, wherein the first housing through-hole is aligned with the first PCBA through-hole; and wherein the second housing through-hole is aligned with the second PCBA through-hole.

4. The flow sensing device of claim 2, wherein the housing comprises an upper housing portion and a lower housing portion.

5. The flow sensing device of claim 4, wherein the first housing through-hole and the second housing through-hole are defined in the upper housing portion.

6. The flow sensing device of claim 4, wherein the lower housing portion at least partially defines the flow path.

7. The flow sensing device of claim 1, wherein the fluid inlet tube is substantially perpendicular to the main body; and wherein the fluid outlet tube is substantially perpendicular to the main body.

8. The flow sensing device of claim 1, further comprising one or more circuit elements in electronic communication with the sensing element to measure a flow signal from the sensing element and convert the flow signal from the sensing element into flow data to be output from the flow sensing device.

9. A method of assembling a flow sensing device, the method comprising providing a housing;

providing a printed circuit board assembly (PCBA) having a first major surface and an opposing second major surface, the PCBA defining at least a first PCBA through-hole and a second PCBA through-hole, the PCBA comprising a sensing element on the first major surface of and in electronic communication with the PCBA;

providing a flow tube at least partially defining a flow path configured to convey a flowing media through the flow sensing device, the flow tube comprising (i) an elongated main body, (ii) a fluid inlet tube in fluid communication with the main body and defining an opening for the flowing media to enter the flow tube, and (iii) a fluid outlet tube in fluid communication with the main body and defining an opening for the flowing media to exit the flow tube;

at least partially disposing the PCBA within the housing; and at least partially disposing the flow tube within the housing, such that (i) the elongated main body is disposed proximate the first major surface of the PCBA, (ii) the flow path is disposed proximate the sensing element such that at least a portion of the flowing media makes direct contact with the sensing element; (iii) the fluid inlet tube protrudes through the first PCBA through-hole to position the opening of the fluid inlet tube proximate the second major surface of the PCBA, and (iv) the fluid outlet tube protrudes through the second PCBA through-hole to position the opening of the fluid outlet tube proximate the second major surface of the PCBA.

10. The method of claim 9, wherein the housing defines at least a first housing through-hole and a second housing through-hole; and wherein the flow tube is disposed such that (i) the fluid inlet tube protrudes through the first housing through-hole to position the opening of the fluid inlet tube outside of the housing and (ii) the fluid outlet tube protrudes through the second housing through-hole to position the opening of the fluid outlet tube outside of the housing.

11. The method of claim 10, wherein the first housing through-hole is aligned with the first PCBA through-hole; and wherein the second housing through-hole is aligned with the second PCBA through-hole.

12. The method of claim 10, wherein the housing comprises an upper housing portion and a lower housing portion.

13. The method of claim 12, wherein the first housing through-hole and the second housing through-hole are defined in the upper housing portion.

14. The method of claim 12, wherein the lower housing portion at least partially defines the flow path.

15. The method of claim 9, wherein the fluid inlet tube is substantially perpendicular to the main body; and wherein the fluid outlet tube is substantially perpendicular to the main body.

16. The method of claim 9, further comprising:

measuring a flow signal from the sensing element; and converting the flow signal from the sensing element into flow data to be output from the flow sensing device.

* * * * *